(12) United States Patent
Lee et al.

(10) Patent No.: US 10,763,288 B1
(45) Date of Patent: Sep. 1, 2020

(54) SEMICONDUCTOR DEVICE AND METHOD FOR FORMING THE SAME

(71) Applicant: Vanguard International Semiconductor Corporation, Hsinchu (TW)

(72) Inventors: Hsin-Hui Lee, Kaohsiung (TW); Han-Liang Tseng, Hsinchu (TW); Jiunn-Liang Yu, Taipei (TW); Kwang-Ming Lin, Taichung (TW); Yin Chen, Hsinchu (TW); Si-Twan Chen, Jhubei (TW); Hsueh-Jung Lin, Jhubei (TW); Wen-Chih Lu, New Taipei (TW); Ting-Jung Lu, Taoyuan (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/277,585

(22) Filed: Feb. 15, 2019

(51) Int. Cl.
*H01L 33/00* (2010.01)
*H01L 21/00* (2006.01)
(Continued)

(52) U.S. Cl.
CPC .... *H01L 27/14623* (2013.01); *H01L 27/3232* (2013.01); *H01L 29/78633* (2013.01); *H01L 31/02162* (2013.01); *H01L 31/02164* (2013.01)

(58) Field of Classification Search
CPC .......... H01L 29/78633; H01L 27/3232; H01L 31/02164
(Continued)

(56) References Cited

U.S. PATENT DOCUMENTS 7,791,011 B2 * 9/2010 Rennie ............. H01L 27/14621
   250/208.1
8,9697,76 B2 * 3/2015 Wano ............... H01L 27/14627
   250/208.1
(Continued)

FOREIGN PATENT DOCUMENTS

TW        I633493 B      8/2018
WO    WO 2018/064563 A1  4/2018

OTHER PUBLICATIONS

Taiwanese Office Action and Search Report dated Jun. 5, 2019 for Application No. 107141668.

*Primary Examiner* — Calvin Lee
(74) *Attorney, Agent, or Firm* — Birch, Stewart, Kolasch & Birch, LLP (57) ABSTRACT

A semiconductor device is provided. The semiconductor device includes a substrate. The substrate includes a plurality of pixels. The semiconductor device also includes a light collimator layer disposed on the substrate. The light collimator layer includes a transparent connection feature disposed on the substrate, and a plurality of transparent pillars disposed on the transparent connection feature. The plurality of transparent pillars cover the plurality of pixels, and the transparent connection feature connects to the plurality of transparent pillars. The plurality of transparent pillars and the transparent connection feature are made of a first material which includes a transparent material. The light collimator layer also includes a plurality of first light-shielding features disposed on the transparent connection feature. The top surface of one of the transparent pillars is level with the top surface of one of the first light-shielding features.

19 Claims, 6 Drawing Sheets

(51) Int. Cl.
    *H01L 27/146* (2006.01)
    *H01L 27/32* (2006.01)
    *H01L 31/0216* (2014.01)
    *H01L 29/786* (2006.01)

(58) Field of Classification Search
    USPC .................................... 438/29–31; 257/98
    See application file for complete search history.

(56) References Cited

U.S. PATENT DOCUMENTS

2016/0132712 A1* 5/2016 Yang .................... G06K 9/0002
                                                                   348/77
2019/0386048 A1* 12/2019 Lee ....................... H01L 31/167

* cited by examiner

SEMICONDUCTOR DEVICE AND METHOD FOR FORMING THE SAME

BACKGROUND

Technical Field

The embodiments of the present disclosure relate to semiconductor manufacturing, and in particular they relate to semiconductor devices including a light collimator layer.

Description of the Related Art

Semiconductor devices can be used in a variety of applications. For example, a semiconductor device can be used as a fingerprint recognition device (or at least a portion of a fingerprint recognition device). The fingerprint recognition device may be formed of a large number of optical elements. For example, the optical elements may include a light collimator, a beam splitter, a focusing mirror, and a line sensor.

The light collimator performs the function of collimating light to reduce energy loss due to light divergence. For example, a light collimator can be applied to a fingerprint recognition device to improve the performance of the fingerprint recognition device.

However, existing light collimators and methods for forming the same are not satisfactory in all respects.

BRIEF SUMMARY

In accordance with some embodiments of the present disclosure, a semiconductor device is provided. The semiconductor device includes a substrate. The substrate includes a plurality of pixels. The semiconductor device also includes a light collimator layer disposed on the substrate. The light collimator layer includes a transparent connection feature disposed on the substrate, and a plurality of transparent pillars disposed on the transparent connection feature. The plurality of transparent pillars cover the plurality of pixels, and the transparent connection feature connects to the plurality of transparent pillars. The plurality of transparent pillars and the transparent connection feature are made of a first material which includes a transparent material. The light collimator layer also includes a plurality of first light-shielding features disposed on the transparent connection feature. The top surface of one of the transparent pillars is level with the top surface of one of the first light-shielding features.

In accordance with some embodiments of the present disclosure, a method of forming a semiconductor device is provided. The method includes providing a substrate and forming a light collimator layer on the substrate. Forming the light collimator layer on the substrate includes providing a first material on the substrate, patterning the first material to form a transparent connection feature and a plurality of transparent pillars on the substrate. The first material includes a transparent material. The transparent connection feature is located between the plurality of transparent pillars and the substrate. Forming the light collimator layer on the substrate also includes forming a plurality of first light-shielding features on the transparent connection features. The top surface of one of the transparent pillars is leveled with the top surface of one of the first light-shielding features.

BRIEF DESCRIPTION OF THE DRAWINGS

The disclosure can be more fully understood from the following detailed description when read with the accompanying figures. It should be noted that various features are not drawn to scale and are for illustrative purposes only. In fact, the dimensions of elements may be arbitrarily increased or reduced for clarity of the technical features of the embodiments of the present disclosure.

DETAILED DESCRIPTION

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Various embodiments of the disclosure are described below. Like numbers may be used to indicate like elements. It is understandable that additional operations may be performed before, during or after the method described, and that in other embodiments of the method, some of the operations may be substituted or omitted.

All of the terms (including technical and scientific terms) used herein have the same meaning as commonly understood by one of ordinary skill in the art. It should be understood that these terms, such as those defined in commonly used dictionaries, should be interpreted as having a meaning consistent with the related art and the background or context of the present disclosure, and should not be interpreted in an idealized or overly formal manner unless specifically defined in the embodiments of the disclosure.

Some embodiments of the present disclosure can be understood in conjunction with the figures, and the figures of the embodiments of the present disclosure are also considered as a part of the description of the embodiments of the present disclosure. It should be understood that the figures of the embodiments of the present disclosure are not illustrated in proportion to actual devices and elements. The shapes and thicknesses of the embodiments may be exaggerated in the figures in order to clearly illustrate the features of the embodiments of the disclosure. In addition, the structures and devices in the figures are schematically illustrated in order to clearly illustrate the features of the embodiments of the disclosure.

First Embodiment

A light collimating layer of a semiconductor device of the present embodiment includes a plurality of transparent pillars covering pixels and a transparent connection feature connecting to the plurality of transparent pillars. The plurality of transparent pillars can protect the pixels, thus reducing or preventing the pixels from being damaged and/or contaminated during the process. In addition, since the transparent connection feature and the plurality of transparent pillars connect to each other, the ratio of the height of the plurality of transparent pillars to the width of the pixels can be increased to enhance the collimation performance of the light collimating layer.

Figure 1A:
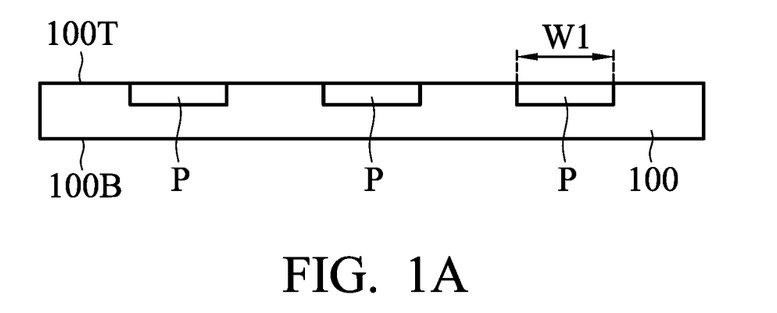
FIGS. 1A, 1B, 1C, 1D, 1E, and 1F are a series of cross-sectional views illustrating a method of forming a semiconductor device in accordance with some embodiments of the present disclosure.

FIG. 1A illustrates an initial step of the method of forming the semiconductor device of the present embodiment. As illustrated in FIG. 1A, a substrate 100 is provided. The substrate 100 may have a top surface 100T and a bottom surface 100B opposite to the top surface 100T.

In some embodiments, the substrate 100 may include an elemental semiconductor (for example, silicon or germanium), a compound semiconductor (for example, silicon carbide (SiC), gallium arsenide (GaAs), indium arsenide (InAs), or indium phosphide (InP)), an alloy semiconductor (for example, SiGe, SiGeC, GaAsP, or GaInP), another suitable semiconductor, or a combination thereof. In some embodiments, the substrate 100 may be a semiconductor-on-insulator (SOI) substrate. The SOI substrate may include a bottom plate, a buried oxide layer disposed on the bottom plate, and a semiconductor layer disposed on the buried oxide layer. In some embodiments, the substrate 100 may be a semiconductor wafer (for example, silicon wafer or other suitable semiconductor wafer).

In some embodiments, the substrate 100 may include various p-type doped regions and/or n-type doped regions formed by ion implantation and/or diffusion processes. For example, the doped regions may be configured to form a transistor, a photodiode, and/or a light emitting diode, but the embodiments of the present disclosure are not limited thereto.

In some embodiments, the substrate 100 may include various isolation features to separate different device regions in the substrate 100. For example, the isolation features may include a shallow trench isolation (STI) feature, but the embodiments of the present disclosure are not limited thereto. In some embodiments, forming shallow trench isolation may include etching a trench in the substrate 100 and filling the trench with an insulating material (for example, silicon oxide, silicon nitride, or silicon oxynitride). The filled trench may have a multilayer structure (for example, a thermal oxide liner and silicon nitride filled in the trench). A chemical mechanical polishing (CMP) process may be performed to polish away excess insulating material and planarize an upper surface of the isolation feature.

In some embodiments, the substrate 100 may include various conductive features (for example, lines or vias). For example, the conductive features may include aluminum (Al), copper (Cu), tungsten (W), an alloy thereof, other suitable conductive materials, or a combination thereof.

Please continue to refer to FIG. 1A, in some embodiments, the substrate 100 may include a plurality of pixels P. In some embodiments, the plurality of pixels P convert a received optical signal into a current signal. In some embodiments, the plurality of pixels P of the substrate 100 may be arranged in an array, but the embodiments of the present disclosure are not limited thereto. For example, in some embodiments, one of the pixels P of the substrate 100 may include or correspond to at least one photodiode and/or other suitable elements, but the embodiments of the present disclosure are not limited thereto. As illustrated in FIG. 1A, the plurality of pixels P may have a width W1. For example, the width W1 may be in a range from 5 to 50 micrometers, but the embodiments of the present disclosure are not limited thereto.

Figure 1B:
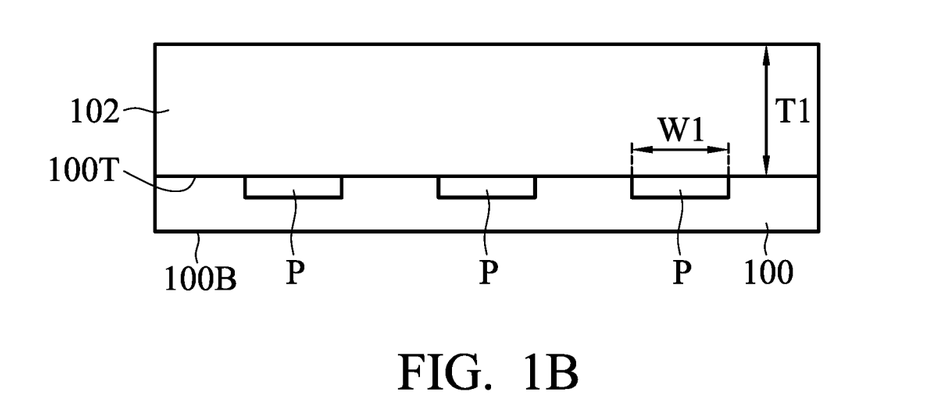

Next, as illustrated in FIG. 1B, a first material 102 is disposed on the top surface 100T of the substrate 100. In detail, in some embodiments, a layer formed of the first material 102 may be formed on the top surface 100T of the substrate 100. For example, a thickness T1 of the layer of the first material 102 may be in a range from 5 to 500 micrometers, but the embodiments of the present disclosure are not limited thereto. In some embodiments, the first material 102 may include a transparent material (for example, a transparent photoresist, polyimide, epoxy), other suitable materials, or a combination thereof. In some embodiments, the first material 102 may include a photocuring material, a thermosetting material, or a combination thereof. For example, the first material 102 may be disposed on the top surface 100T of the substrate 100 by using a spin-on coating process, but the embodiments of the present disclosure are not limited thereto.

Figure 1C:
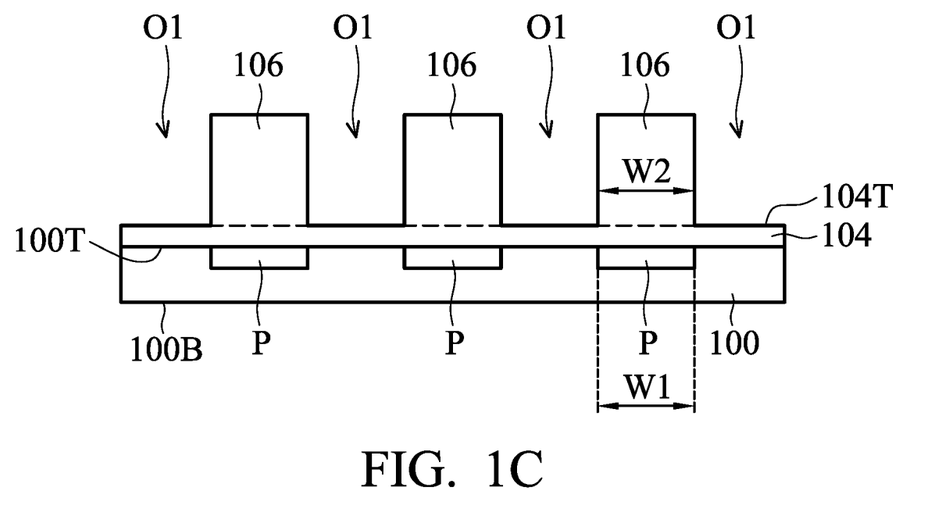

Next, as illustrated in FIG. 1C, a patterning process is performed to pattern the first material 102 to form a transparent connection feature 104 and a plurality of transparent pillars 106. In detail, the patterning process removes a portion of the first material 102, and the first material 102 remaining on the top surface 100T of the substrate 100 becomes the transparent connection feature 104 and the plurality of transparent pillars 106. In some embodiments, the patterning process may include a photolithography process. For example, the photolithography process may include mask aligning, exposure, post-exposure baking, developing photoresist, other suitable processes, or a combination thereof.

In some embodiments, as illustrated in FIG. 1C, the transparent connection feature 104 is on the top surface 100T of the substrate 100, and the plurality of transparent pillars 106 are located on the top surface 104T of the transparent connection feature 104. Furthermore, in some embodiments, the plurality of transparent pillars 106 may protrude from the top surface 104T of the transparent connection feature 104. In some embodiments, the transparent connection feature 104 and the plurality of transparent pillars 106 include the same material and are integrally formed.

As illustrated in FIG. 1C, in some embodiments, since the transparent connection feature 104 connects to the plurality of transparent pillars 106, the collapse of the plurality of transparent pillars 106 can be reduced or avoided, thereby improving yield of the semiconductor device and reducing production costs.

In some embodiments, the plurality of transparent pillars 106 correspond to the plurality of pixels P. In other words, in such embodiments, one transparent pillar 106 may completely cover or partially cover its corresponding pixel P. As illustrated in FIG. 1C, in some embodiments, the plurality of transparent pillars 106 may have a width W2 substantially uniform. For example, the width W2 may be in a range from 5 to 50 micrometers, but the embodiments of the present disclosure are not limited thereto. In some embodiments, the plurality of transparent pillars 106 covering the plurality of pixels P can protect the plurality of pixels P and reduce or prevent the plurality of pixels P from being damaged and/or contaminated during the process.

In some embodiments, as illustrated in FIG. 1C, the width W2 of the plurality of transparent pillars 106 may be substantially the same as the width W1 of the plurality of pixels P. In other words, in such embodiments, sidewalls of one transparent pillar 106 may be aligned with sidewalls of its corresponding pixel P. In some other embodiments, the width W2 of the plurality of transparent pillars 106 may be greater or less than the width W1 of the plurality of pixels P.

In some embodiments, as illustrated in FIG. 1C, the patterning process forms a plurality of openings O1 exposing the transparent connection feature 104 on the substrate 100, and a suitable light-shielding material is filled in the plurality of openings O1 in a subsequent process to form the plurality of light-shielding features of the light collimating layer of these embodiment, which is described in detail below.

Figure 1D:
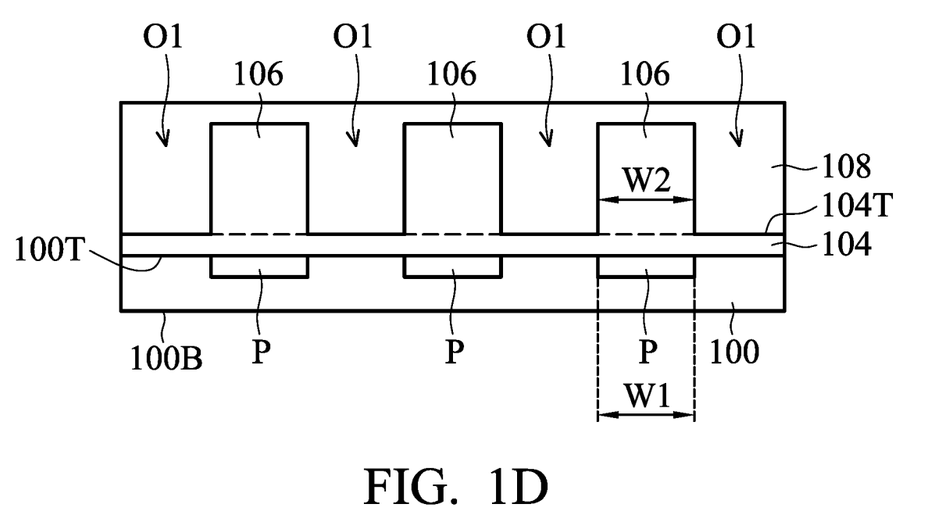

Next, as illustrated in FIG. 1D, in some embodiments, a light-shielding material 108 is disposed on the top surface 100T of the substrate 100. In some embodiments, the light-shielding material 108 may be in direct contact with the top surface 104T of the transparent connection feature 104. In some embodiments, the light-shielding material 108 may fill the opening O1 and cover the transparent connection feature 104 and the plurality of transparent pillars 106. For example, the light-shielding material 108 may include photoresist (for example, a black photoresist or other suitable non-transparent photoresist), ink (for example, a black ink or other suitable non-transparent ink), molding compound (for example, black molding compound or other suitable non-transparent molding compound), a solder mask material (for example, a black solder mask material or other suitable non-transparent solder mask material), epoxy resin, other suitable materials, or a combination thereof. In some embodiments, the light-shielding material 108 may be a photocuring material, a thermosetting material, or a combination thereof. In some embodiments, a curing process may be performed to cure the light-shielding material 108 after disposing the light-shielding material 108 on the top surface 100T of the substrate 100. For example, the curing process may be a photocuring process, a thermosetting process, or a combination thereof.

Figure 1E:
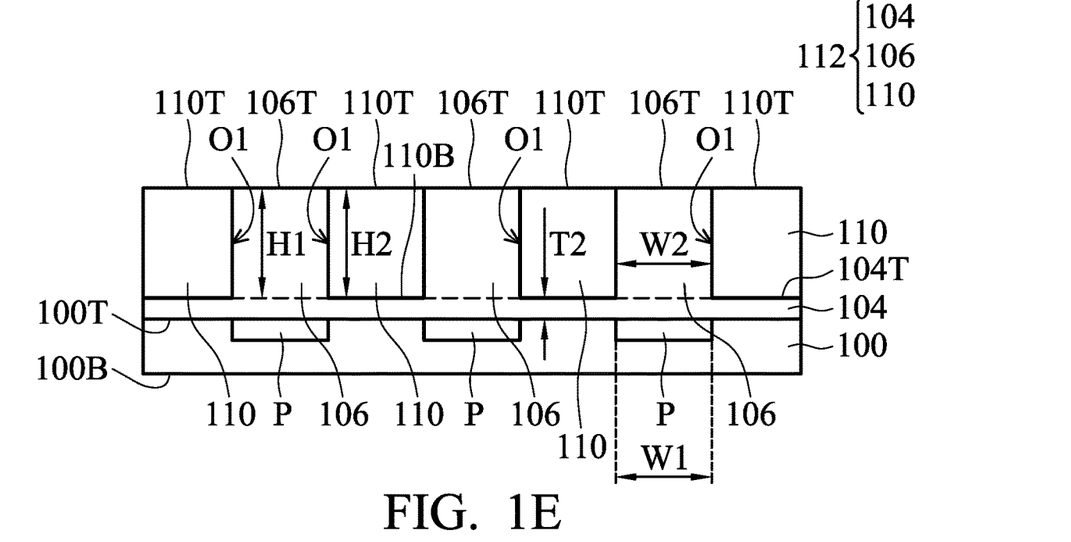

Next, as illustrated in FIG. 1E, in some embodiments, a planarization process is performed to remove a top portion of the light-shielding material 108 to expose the plurality of transparent pillars 106. In some embodiments, the planarization process also removes a portion of the plurality of transparent pillars 106 (for example, a top portion of the plurality of transparent pillars 106). In some embodiments, the planarization process may be a CMP process, a grinding process, an etch back process, other suitable processes, or a combination thereof.

In some embodiments, the light-shielding material 108 remaining on the top surface 100T of the substrate 100 after the planarization process becomes a plurality of light-shielding features 110. In some embodiments, the plurality of light-shielding features 110 do not cover or only partially cover the plurality of pixels P. In some embodiments, as illustrated in FIG. 1E, the transparent connection feature 104, the plurality of transparent pillars 106, and the plurality of light-shielding features 110 may collectively serve as the light collimating layer 112 of the semiconductor device. In some embodiments, the plurality of transparent pillars 106 of the light collimating layer 112 and the plurality of light-shielding features 110 may be alternately arranged.

As illustrated in FIG. 1E, in some embodiments, the plurality of light-shielding features 110 may have a bottom surface 110B which is substantially flat, but the embodiments of the present disclosure are not limited thereto. In some other embodiments, the bottom surface 110B of the plurality of light-shielding features 110 may be curved or any other suitable shape. In some embodiments, the bottom surface 110B of the plurality of light-shielding features 110 is in direct contact with the top surface 104T of the transparent connection feature 104.

In some embodiments, as illustrated in FIG. 1E, the top surface 110T of the plurality of light-shielding features 110 may be leveled with a top surface 106T of the plurality of transparent pillars 106. In other words, in such embodiments, the top surface 110T of the plurality of light-shielding features 110 may be coplanar with the top surface 106T of the plurality of transparent pillars 106. In some embodiments, a height H1 of the plurality of transparent pillars 106 and a height H2 of the plurality of light-shielding features 110 may be substantially equal. For example, the height H1 of the plurality of transparent pillars 106 and the height H2 of the plurality of light-shielding features 110 may each be in a range from 5 to 500 micrometers, but the embodiments of the present disclosure are not limited thereto.

In some embodiments, the ratio of thickness T2 of the transparent connection feature 104 to height H1 of the plurality of transparent pillars 106 (i.e., T2/H1) is greater than 10, which may degrade the performance of the light collimator layer 112. Therefore, in some other embodiments, the ratio of the thickness T2 of the transparent connection feature 104 to the height H1 of the plurality of transparent pillars 106 (i.e., T2/H1) may be less than or equal to 10 (for example, 0<(T2/H1)≤10), and the above-mentioned problem caused by the high ratio of thickness T2 to height H1 can be avoided.

In some embodiments, since the transparent connection feature 104 connects to the plurality of transparent pillars 106, the plurality of transparent pillars 106 can have a greater height H1 without collapsing. In other words, in such embodiments, the height H1 of the plurality of transparent pillars 106 and the width W1 of the plurality of pixels P may have a greater ratio (for example, 5≤(H1/W1)≤50), and the collimation performance of the light collimating layer 112 can be enhanced.

In some embodiments, the plurality of light-shielding features 110 of the light collimating layer 112 is black (for example, the plurality of light-shielding features 110 is formed of a black photoresist, a black ink, a black molding compound, or a black solder mask material), thereby the collimation performance of the light collimating layer 112 can be enhanced.

Figure 1F:
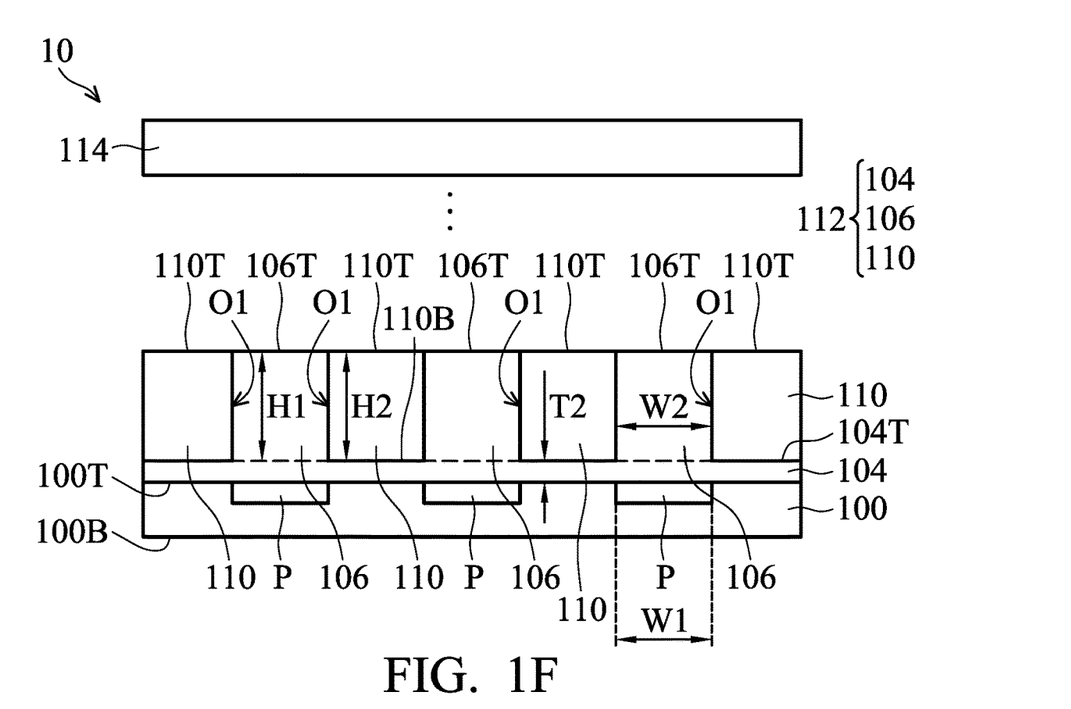

For example, in some embodiments, a light source such as a light emitting diode (not illustrated in the figures), a blocking layer (not illustrated in the figures), other suitable optical elements, or a combination thereof may be disposed on the light collimating layer 112, and a cover plate 114 (for example, a glass cover plate) is disposed on the optical elements to form a semiconductor device 10 such as a fingerprint recognition device (as illustrated in FIG. 1F).

In summary, the light collimating layer of the semiconductor device of the present embodiment includes a plurality of transparent pillars covering the plurality of pixels and a transparent connection feature connecting to the plurality of transparent pillars. The plurality of transparent pillars can reduce or prevent the plurality of pixels from being damaged and/or contaminated during the process. In addition, since the transparent connection feature and the plurality of transparent pillars connect to each other, the ratio of the height of the plurality of transparent pillars to the width of the plurality of pixels can be increased to improve the collimation performance of the light collimating layer.

Some variations of the semiconductor device 10 of the present embodiment are provided below. It should be noted that the same or similar elements as those of the above-mentioned embodiments will be denoted by the same element symbols unless otherwise specified, and the methods for forming the same may be the same or similar to the methods for forming the same of the above-mentioned embodiment.

Figure 2:
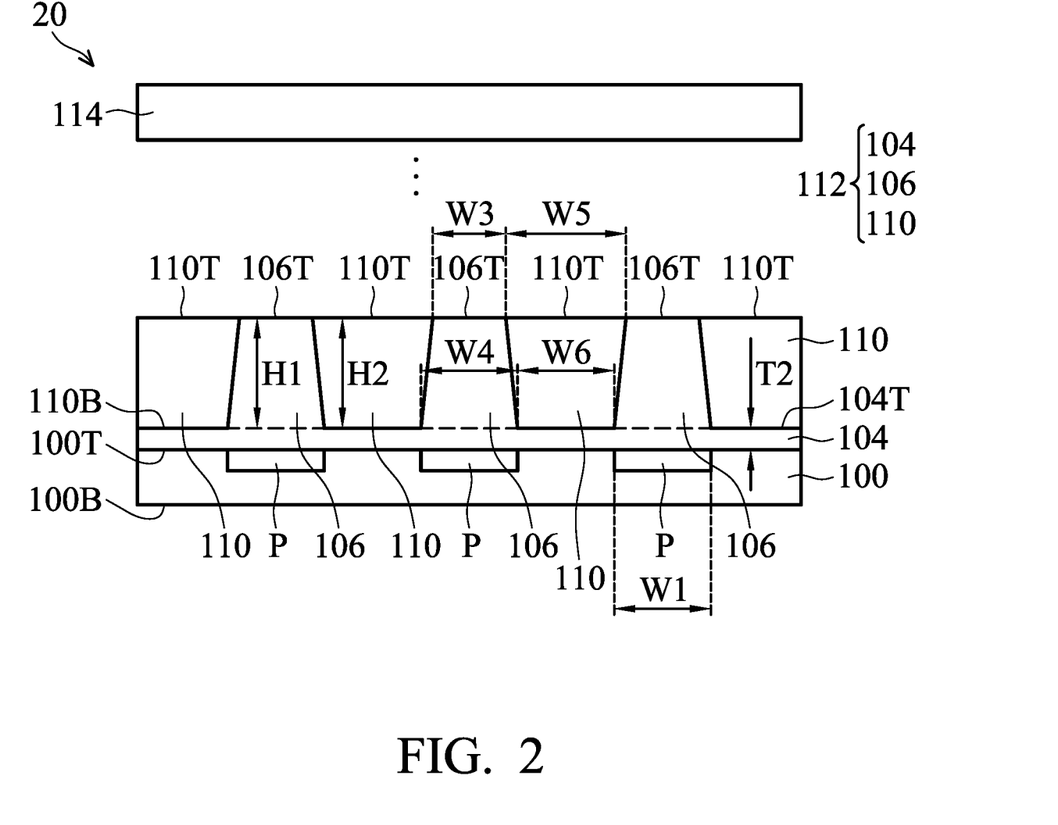
FIG. 2 illustrates a cross-sectional view of a semiconductor device 20 in accordance with some embodiments of the present disclosure.

FIG. 2 illustrates a semiconductor device 20 in accordance with some embodiments of the present disclosure. One of the differences between the semiconductor device 20 and the semiconductor device 10 is that the top width W3 of the plurality of transparent pillars 106 of the light collimating layer 112 of the semiconductor device 20 is smaller than the bottom width W4, and thus the collapse of the plurality of transparent pillars 106 can be further reduced or avoided. In some embodiments, since the top width W3 of the plurality of transparent pillars 106 is less than the bottom width W4, the top width W5 of the plurality of light shielding feature 110 is greater than a bottom width W6. For example, in such embodiments, the ratio of the top width W3 of the plurality of transparent pillars 106 to the bottom width W4 may be in a range from 0.1 to 0.99 and the ratio of the top width W5 of the plurality of light shielding features 110 to the bottom width W6 may be in a range from 1.01 to 2.

Figure 3:
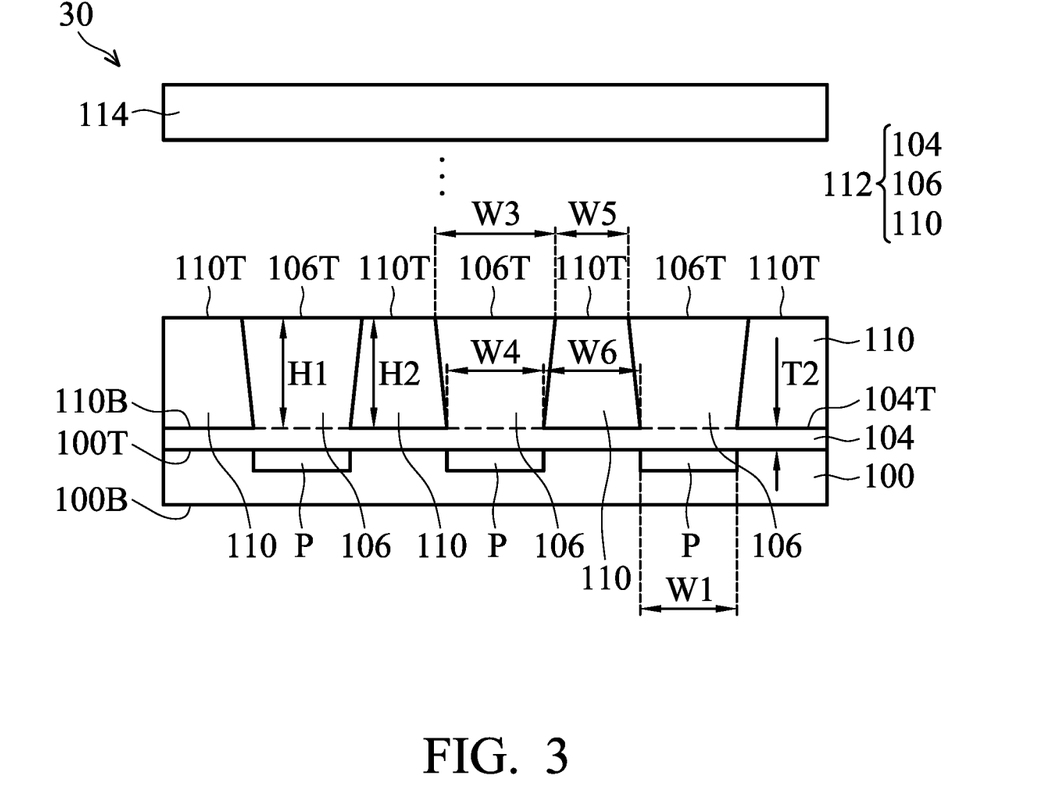
FIG. 3 illustrates a cross-sectional view of a semiconductor device 30 in accordance with some embodiments of the present disclosure.

FIG. 3 illustrates a semiconductor device 30 in accordance with some embodiments of the present disclosure. One of the differences between the semiconductor device 30 and the semiconductor device 10 is that the top width W3 of the plurality of transparent pillars 106 of the light collimating layer 112 of the semiconductor device 30 is greater than the bottom width W4. In some embodiments, since the top width W3 of the plurality of transparent pillars 106 is greater than the bottom width W4, the top width W5 of the plurality of light-shielding features 110 is less than the bottom width W6. For example, in such embodiments, the ratio of the top width W3 of the plurality of transparent pillars 106 to the bottom width W4 may be in a range from 1.01 to 2, and the ratio of the top width W5 of the plurality of light shielding feature 110 to the bottom width W6 may be in a range from 0.1 to 0.99.

Figure 4:
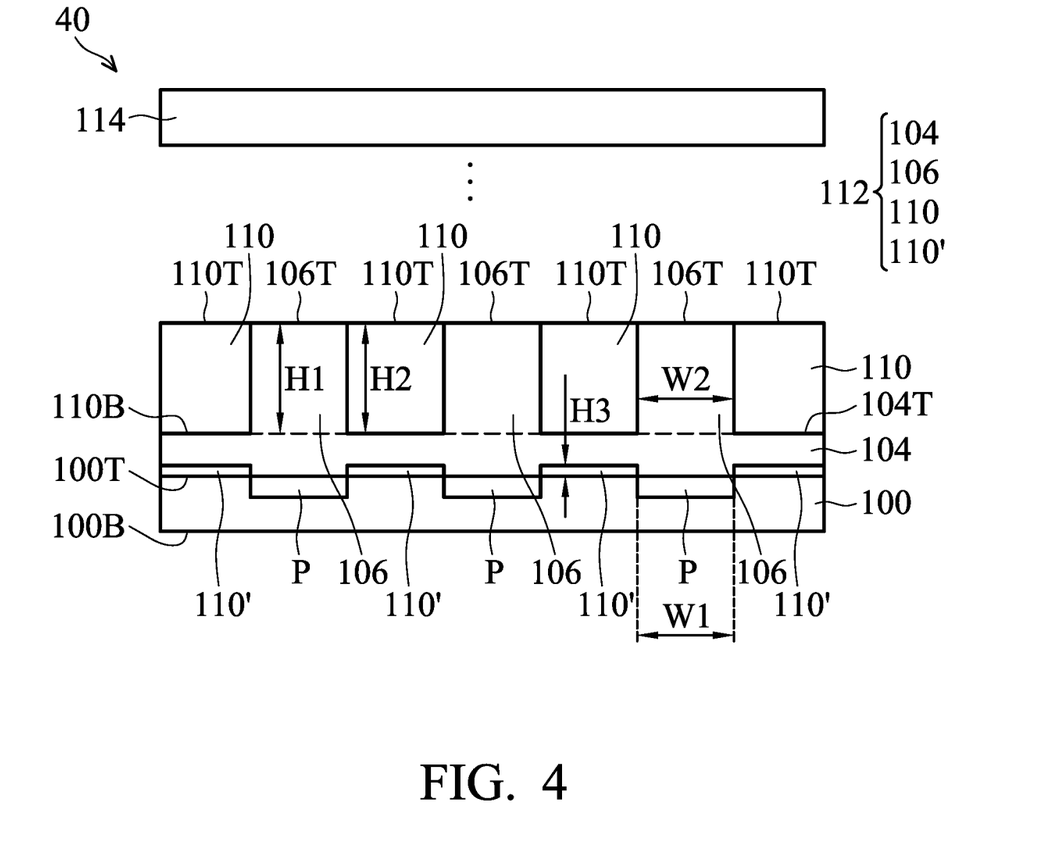
FIG. 4 illustrates a cross-sectional view of a semiconductor device 40 in accordance with some embodiments of the present disclosure.

FIG. 4 illustrates a semiconductor device 40 in accordance with some embodiments of the present disclosure. One of the differences between the semiconductor device 40 and the semiconductor device 10 is that the light collimating layer 112 of the semiconductor device 40 further includes a plurality of light-shielding features 110' disposed on the top surface 100T of the substrate 100 to further improve the collimation performance of the light collimator layer 112. In some embodiments, as illustrated in FIG. 4, the transparent connection feature 104 may be located between the plurality of light-shielding features 110' and the plurality of light-shielding features 110. In some embodiments, the plurality of light-shielding features 110' are in direct contact with the top surface 100T of the substrate 100. In some embodiments, the plurality of light-shielding features 110' do not cover or only partially cover the plurality of pixels P.

As illustrated in FIG. 4, the plurality of light-shielding features 110' may have a height H3. In some embodiments, the height H3 of the plurality of light-shielding features 110' is less than the height H2 of the plurality of light-shielding features 110. For example, the ratio of the height H3 to the height H2 may be in a range from 0.001 to 0.99.

In some embodiments, the plurality of light-shielding features 110' may be formed on the top surface 100T of the substrate 100 before forming the transparent connection feature 104 and the plurality of transparent pillars 106. For example, forming the plurality of light-shielding features 110' may include a photolithography process (for example, photoresist coating, mask aligning, exposure, post-exposure baking, developing photoresist, other suitable process, or a combination thereof), other suitable process, or a combination of thereof. For example, the plurality of light-shielding features 110' may be formed of materials that are the same or similar to the material of the light-shielding material 108.

The foregoing description outlines several embodiments so that those skilled in the art may better understand the embodiments of the present disclosure from various aspects. Those skilled in the art should appreciate that other processes and structures can be readily designed or modified based on the embodiments of the present disclosure to achieve the same purposes and/or to achieve advantages as the embodiments described herein. Those skilled in the art should also appreciate that such equivalent structures are not departing from the spirit and scope of the embodiments of the present disclosure. Various changes, substitution, or modifications may be made to the embodiments of the present disclosure without departing from the spirit and scope of the embodiments of the present disclosure.

In addition, each claim of the present disclosure may be an individual embodiment, and the scope of the present disclosure includes a combination of each of the embodiments of the present disclosure and each of the claims.

What is claimed is:

1. A method for forming a semiconductor device, comprising:
   providing a substrate, wherein the substrate comprises a plurality of pixels;
   forming a light collimator layer on the substrate, wherein forming the light collimator layer on the substrate comprises:
   disposing a first material on the substrate, wherein the first material comprises a transparent material;
   patterning the first material to form a transparent connection feature on the substrate and a plurality of transparent pillars on the transparent connection feature covering the plurality of pixels, wherein the transparent connection feature is located between the plurality of transparent pillars and the substrate;
   forming a plurality of first light-shielding features on the transparent connection feature, wherein the first light-shielding features are formed of opaque materials, and wherein a top surface of one of the transparent pillars is level with a top surface of one of the first light-shielding features; and
   forming a plurality of second light-shielding features disposed on the substrate, wherein the transparent connection feature is located between the plurality of first light-shielding features and the plurality of second light-shielding features.

2. The method as claimed in claim 1, wherein forming the light collimator layer on the substrate further comprises:
   forming the plurality of second light-shielding features on the substrate before forming the transparent connection feature and the plurality of transparent pillars.

3. The method as claimed in claim 1, wherein the plurality of first light-shielding features are formed of photoresist, ink, molding compound, solder mask material, or a combination thereof.

4. The method as claimed in claim 1, wherein a ratio of a thickness of the transparent connection feature to a height of one of the transparent pillars is greater than 0 and less than or equal to 10.

5. The method as claimed in claim 1, wherein a ratio of a height of one of the plurality of transparent pillars to a width of one of the pixels is in a range from 5 to 50.

6. The method as claimed in claim 1, wherein a height of one of the transparent pillars is equal to a height of one of the first light-shielding features.

7. The method as claimed in claim 1, wherein forming the plurality of first light-shielding features on the transparent connection feature comprises:
   disposing a light-shielding material on the transparent connection feature; and
   performing a planarization process to planarize the light-shielding material.

8. The method as claimed in claim 7, wherein the planarization process comprises a chemical mechanical polishing process.

9. A semiconductor device, comprising:
   a substrate, wherein the substrate comprises a plurality of pixels; and
   a light collimator layer disposed on the substrate, wherein the light collimator layer comprises:
      a transparent connection feature disposed on the substrate;
      a plurality of transparent pillars disposed on the transparent connection feature, wherein the plurality of transparent pillars cover the plurality of pixels, and the transparent connection feature connects to the plurality of transparent pillars, wherein the plurality of transparent pillars and the transparent connection feature are made of a first material which comprises a transparent material;
      a plurality of first light-shielding features disposed on the transparent connection feature, wherein the first light-shielding features are formed of opaque materials, and wherein a top surface of one of the transparent pillars is level with a top surface of one of the first light-shielding features; and
      a plurality of second light-shielding features disposed on the substrate, wherein the transparent connection feature is located between the plurality of first light-shielding features and the plurality of second light-shielding features.

10. The semiconductor device as claimed in claim 9, wherein the plurality of first light-shielding features and the plurality of second light-shielding features do not overlap the plurality of pixels in a vertical projection direction of the substrate.

11. The semiconductor device as claimed in claim 9, wherein the plurality of first light-shielding features do not overlap the plurality of pixels in a vertical projection direction of the substrate.

12. The semiconductor device as claimed in claim 9, wherein the plurality of first light-shielding features are formed of photoresist, ink, molding compound, solder mask material, or a combination thereof.

13. The semiconductor device as claimed in claim 9, wherein a ratio of a thickness of the transparent connection feature to a height of one of the transparent pillars is greater than 0 and less than or equal to 10.

14. The semiconductor device as claimed in claim 9, wherein the plurality of first light-shielding features and the plurality of transparent pillars are alternately arranged on the transparent connection feature.

15. The semiconductor device as claimed in claim 9, wherein one of the transparent pillars has a top width and a bottom width, wherein the top width is less than the bottom width.

16. The semiconductor device as claimed in claim 9, wherein the plurality of first light-shielding features is in direct contact with a top surface of the transparent connection feature.

17. The semiconductor device as claimed in claim 9, wherein a ratio of a height of one of the plurality of transparent pillars to a width of one of the pixels is in a range from 5 to 50.

18. The semiconductor device as claimed in claim 9, wherein a height of one of the transparent pillars is equal to a height of one of the first light-shielding features.

19. The semiconductor device as claimed in claim 15, wherein a ratio of the top width to the bottom width is in a range from 0.1 to 0.99.

* * * * *